US008081767B2

(12) United States Patent
Chen

(10) Patent No.: US 8,081,767 B2
(45) Date of Patent: Dec. 20, 2011

(54) METHOD FOR ADJUSTING FREQUENCY RESPONSE CURVE OF SPEAKER

(75) Inventor: Meng-Chun Chen, Tu-Cheng (TW)

(73) Assignee: Chi Mei Communication Systems, Inc., Tu-Cheng, New Taipei (TW)

( * ) Notice: Subject to any disclaimer, the term of this patent is extended or adjusted under 35 U.S.C. 154(b) by 993 days.

(21) Appl. No.: 12/024,953

(22) Filed: Feb. 1, 2008

(65) Prior Publication Data

US 2009/0169025 A1 Jul. 2, 2009

(30) Foreign Application Priority Data

Dec. 27, 2007 (CN) .......................... 2007 1 0203451

(51) Int. Cl.
*H04R 29/00* (2006.01)
*H03G 5/00* (2006.01)

(52) U.S. Cl. ............................................ 381/59; 381/98

(58) Field of Classification Search .................... 381/59, 381/98
See application file for complete search history.

(56) References Cited

U.S. PATENT DOCUMENTS

| | | | | | |
|---|---|---|---|---|---|
| 3,477,288 | A * | 11/1969 | Eduard et al. | 73/159 |
| 3,946,600 | A * | 3/1976 | Rettig et al. | 73/587 |
| 4,173,941 | A * | 11/1979 | Castagna | 116/307 |
| 4,327,250 | A * | 4/1982 | von Recklinghausen | 381/55 |
| 5,694,373 | A * | 12/1997 | Garde | 367/135 |
| 7,068,041 | B2 * | 6/2006 | Hoyte et al. | 324/525 |
| 2006/0153403 | A1 * | 7/2006 | Lechner | 381/102 |
| 2007/0104336 | A1 * | 5/2007 | Knight et al. | 381/99 |
| 2008/0069385 | A1 * | 3/2008 | Revit | 381/321 |
| 2009/0279707 | A1 * | 11/2009 | Swartz | 381/58 |
| 2010/0272270 | A1 * | 10/2010 | Chaikin et al. | 381/59 |

* cited by examiner

*Primary Examiner* — A O Williams
(74) *Attorney, Agent, or Firm* — Altis Law Group, Inc.

(57) ABSTRACT

A method for adjusting frequency response curve of a speaker comprises these steps: testing sensitivity of the speaker in at least two types of hardware conditions and recording corresponding frequency response curves; selecting a frequency response curve that comes closest to falling within a predetermined range for selected frequency ranges; and adjusting the selected frequency response curve with a filter.

6 Claims, 6 Drawing Sheets

METHOD FOR ADJUSTING FREQUENCY RESPONSE CURVE OF SPEAKER

BACKGROUND OF THE INVENTION

1. Field of the Invention

The present invention relates to a method for adjusting sensitivity of a speaker, particularly to a method for adjusting frequency response curve of a speaker with a filter.

2. Description of Related Art

When a speaker is used to generate audio signals, quality of the audio signals is affected by some parameters, such as sensitivity, voltage, and frequency of the speaker. In use, it is usually difficult to adjust voltage and frequency of the speaker. Therefore, sensitivity of the speaker is often adjusted to improve quality of the audio signals.

A typical method for adjusting sensitivity of a speaker includes these steps: detecting sensitivity of the speaker; showing the sensitivity with a frequency response curve; and adjusting the frequency response curve of the speaker with a filter. Steps of adjusting the curve are recorded, and software configured for controlling the speaker can be amended according to the record to get a predetermined sensitivity of the speaker. However, shape of the speaker, accessories of the speaker, and housing for the speaker, are not considered in the typical method. When the speaker is used with different hardware conditions, it is difficult to achieve the best sensitivity with the typical method.

Therefore, a new method for adjusting a frequency response curve of a speaker is desired in order to overcome the above-described shortcomings.

SUMMARY

A method for adjusting a frequency response curve of a speaker comprises these steps: testing sensitivity of the speaker in at least two types of hardware conditions and recording corresponding frequency response curves; selecting a frequency response curve that comes closest to falling within a predetermined range for selected frequency ranges; and adjusting the selected frequency response curve with a filter.

Other advantages and novel features will become more apparent from the following detailed description when taken in conjunction with the accompanying drawings.

BRIEF DESCRIPTION OF THE DRAWINGS

Many aspects of the present method for adjusting frequency response curve of a speaker can be better understood with reference to the following drawings. The components in the various drawings are not necessarily drawn to scale, the emphasis instead being placed upon clearly illustrating the principles of the present method for adjusting frequency response curve of a speaker. Moreover, in the drawings, like reference numerals designate corresponding parts throughout the diagrams.

DETAILED DESCRIPTION OF THE INVENTION

Figure 1:
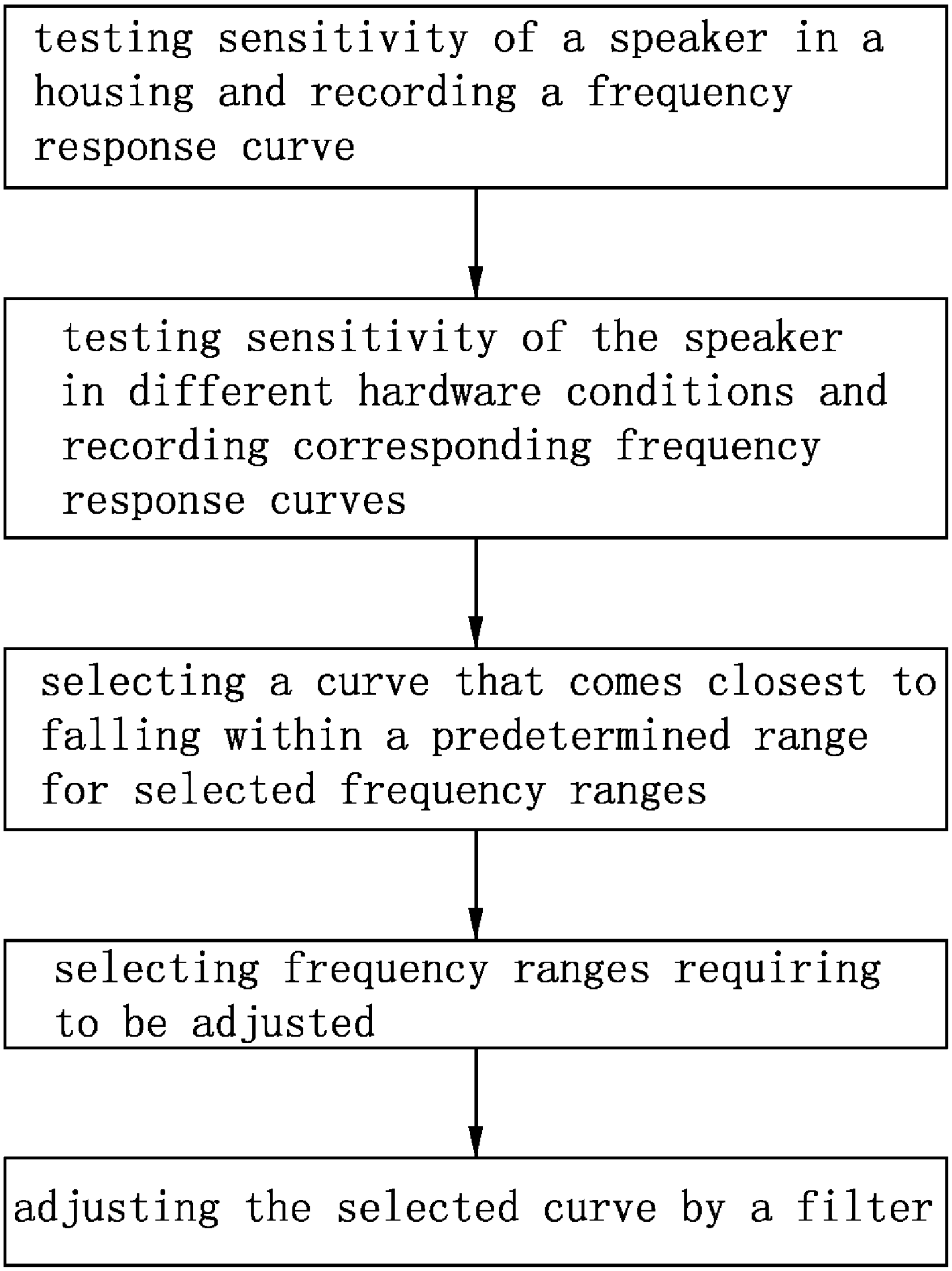
FIG. 1 is a diagram of a method for adjusting a frequency response curve of a speaker, in accordance with a first embodiment.

Referring to FIG. 1, a method for adjusting a frequency response curve of a speaker is provided. The method includes these steps as follows.

First, testing and recording sensitivity of the speaker used in a housing of a portable electronic device, such as a mobile phone, and recording a frequency response curve to show the sensitivity. Testing and recording tools can be typical acoustic testing apparatuses and computers. An original frequency response curve is recorded to show sensitivity of the speaker. The frequency response curve is a function of frequency of audio signals received by the speaker in Hertz (Hz), and sensitivity of the speaker in decibel pascals per volt (dBPa/V).

Figure 2:
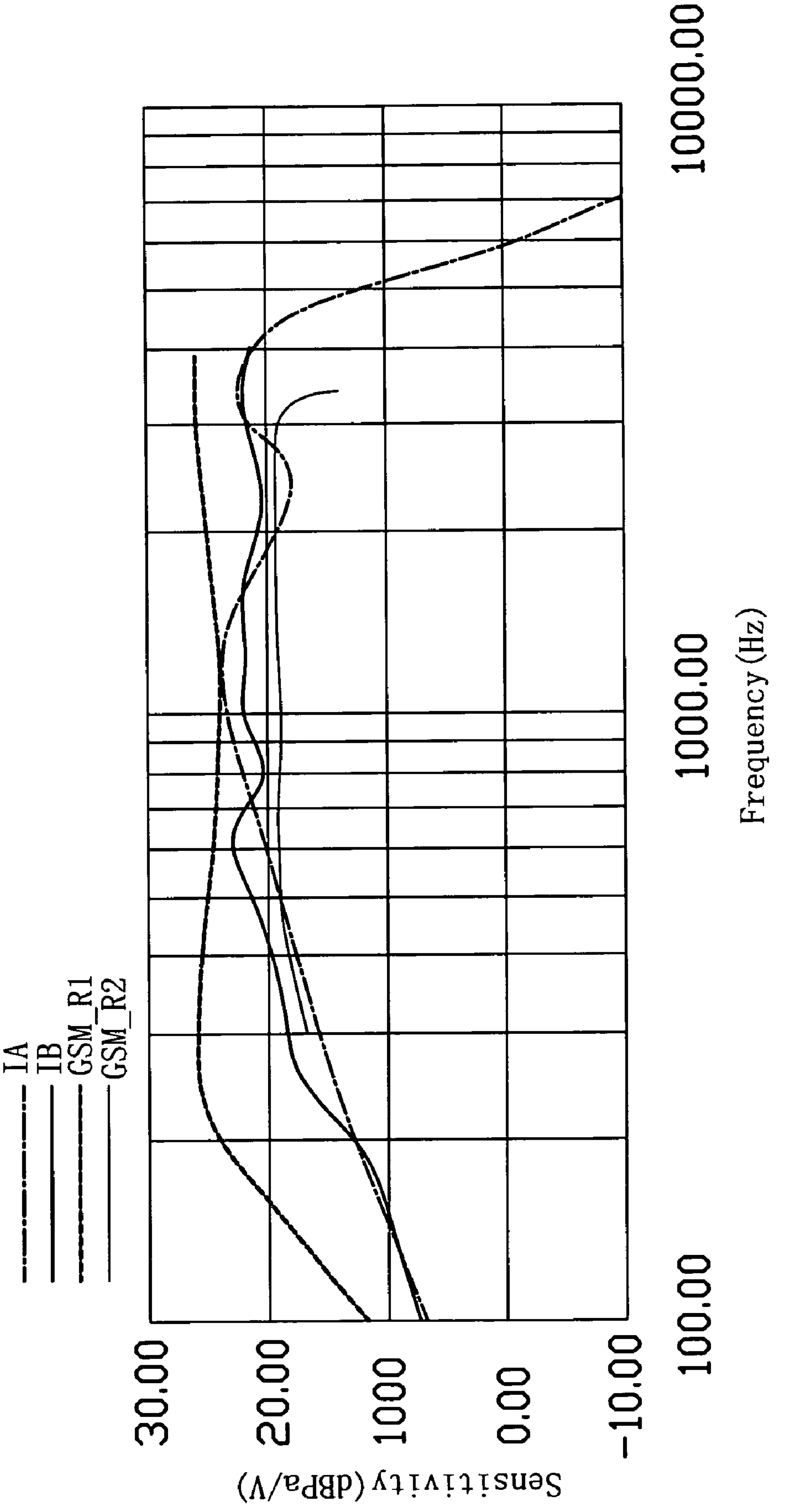
FIG. 2 is an image of adjusting a frequency response curve of a speaker without any mesh by means of the method of FIG. 1.

Also referring to FIG. 2, the curve IA is a frequency response curve of the speaker received in the housing of the portable electronic device, such as a mobile phone. Two curves GSM_R1 and GSM_R2 are respectively used to show predetermined upper and lower limits of sensitivity of the speaker, which are required in GSM communicating systems. It is shown that some parts of the curve IA exceed the range between the curves GSM_R1 and GSM_R2. Data of the curve IA can be referred to in Table 1.

TABLE 1

Sensitivity of a speaker without any mesh

| | Frequency (Hz) | | | | | | | | |
|---|---|---|---|---|---|---|---|---|---|
| | 100 | 125 | 160 | 200 | 250 | 315 | 400 | 500 | 630 |
| IA: Sensitivity before adjusting (dBPa/V) | 6.69 | 8.84 | 10.82 | 12.93 | 14.64 | 16.12 | 17.51 | 18.96 | 20.38 |
| IB: Sensitivity after adjusting (dBPa/V) | 7.26 | 8.84 | 10.82 | 12.93 | 17.21 | 18.69 | 20.08 | 21.53 | 22.95 |

| | Frequency (Hz) | | | | | | | |
|---|---|---|---|---|---|---|---|---|
| | 800 | 1000 | 1250 | 1600 | 2000 | 2500 | 3150 | 4000 |
| IA: Sensitivity before adjusting (dBPa/V) | 21.84 | 23.34 | 23.76 | 21.99 | 19.15 | 17.97 | 21.91 | 20.85 |

TABLE 1-continued

| Sensitivity of a speaker without any mesh | | | | | | | | |
|---|---|---|---|---|---|---|---|---|
| IB: Sensitivity after adjusting (dBPa/V) | 20.41 | 21.91 | 21.76 | 21.99 | 20.72 | 20.54 | 21.91 | 21.42 |

Second, testing sensitivity of the speaker used in portable electronic devices and in different hardware conditions, and recording corresponding frequency response curves. Since the speaker is used inside the portable electronic device, hardware conditions in the portable electronic device can affect acoustic characteristics of the speaker. Generally, the hardware that influences sensitivity of the speaker includes the housing of the portable electronic device and the mesh mounted on the speaker. Therefore, when different types of mesh are respectively mounted on the speaker, sensitivity of the speaker can be tested and recorded in different hardware conditions.

Figure 3:
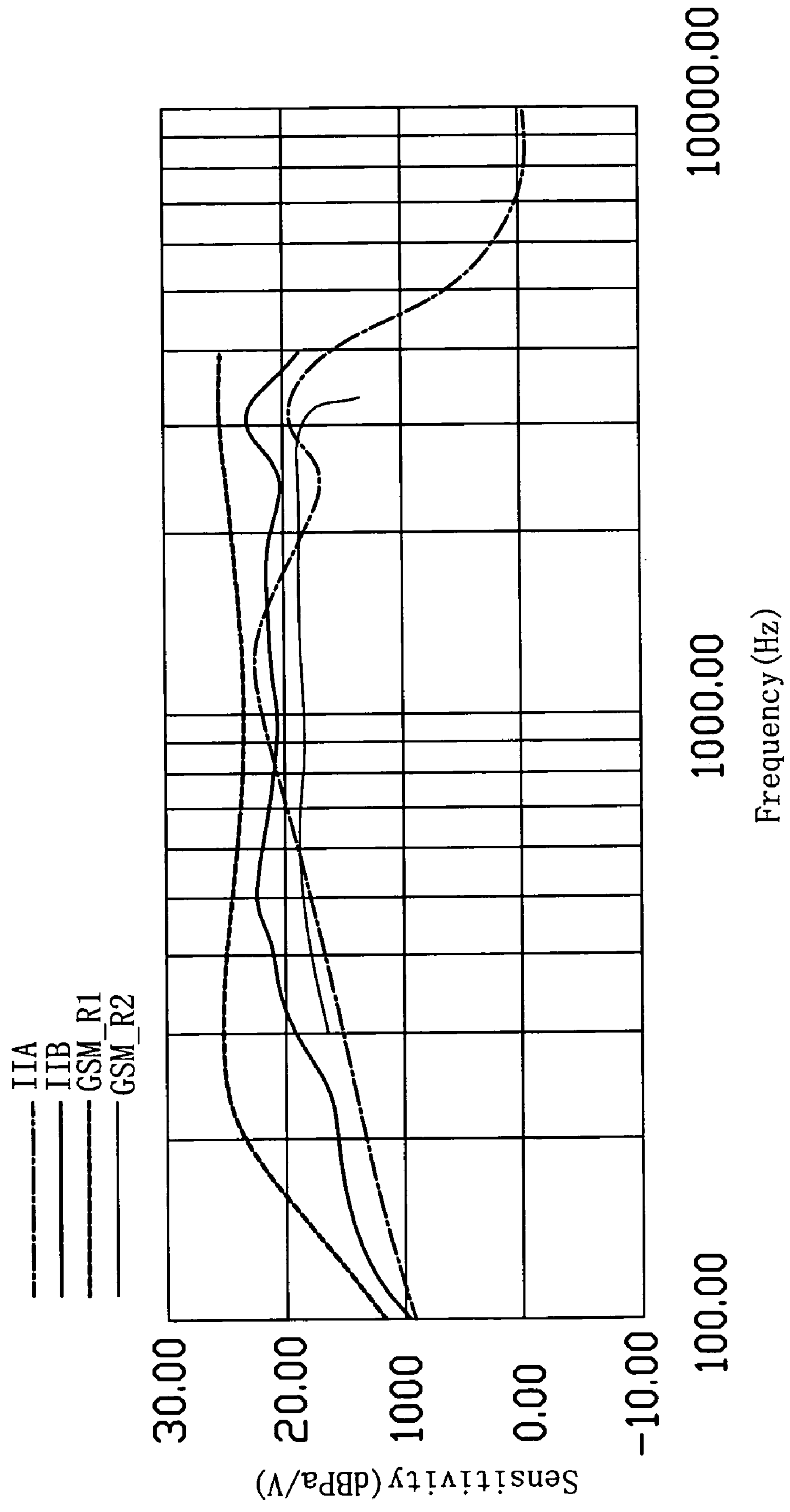
FIG. 3 is an image of adjusting a frequency response curve of a speaker with a first mesh by means of the method of FIG. 1.
Figure 4:
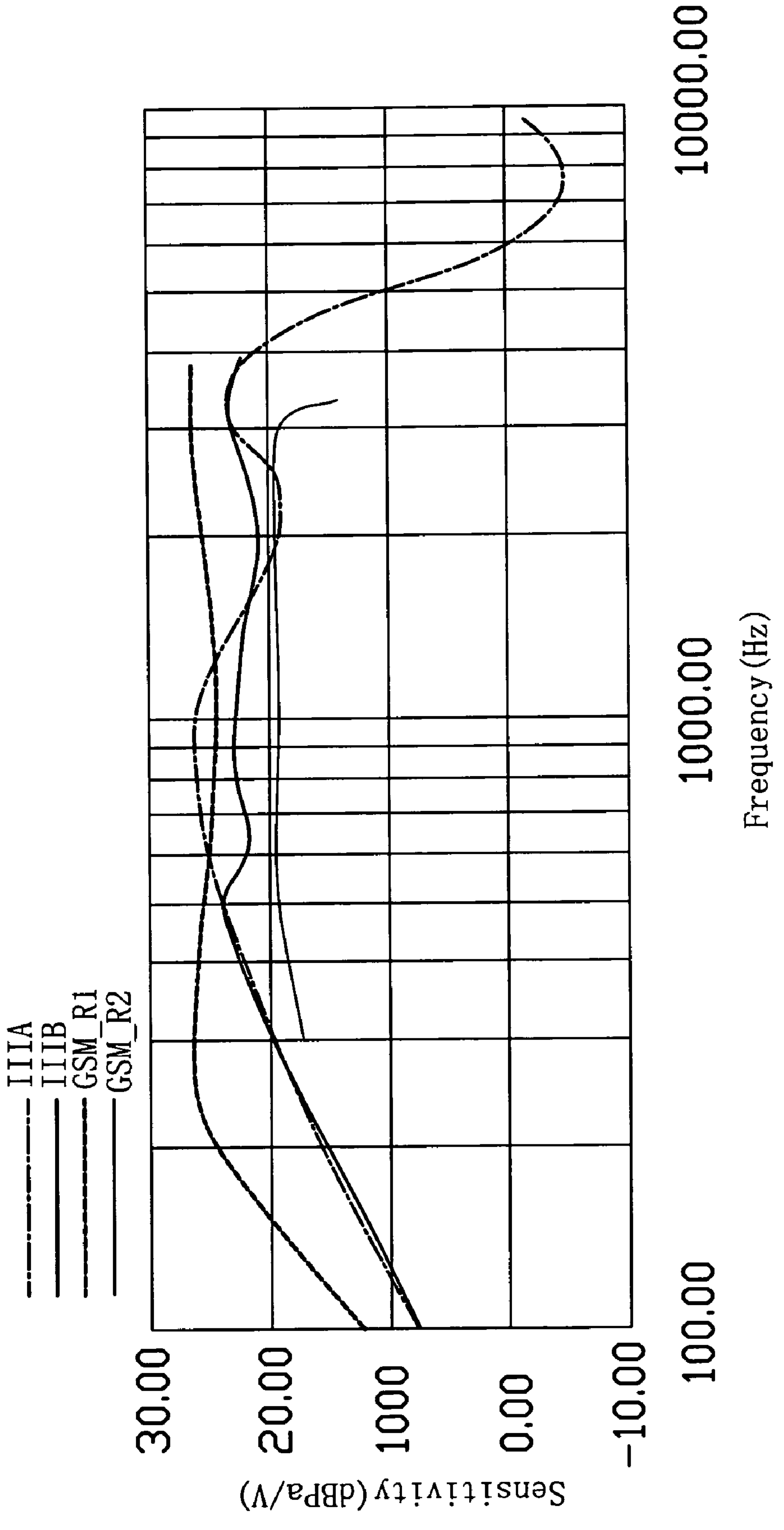
FIG. 4 is an image of adjusting a frequency response curve of a speaker with a second mesh by means of the method of FIG. 1.
Figure 5:
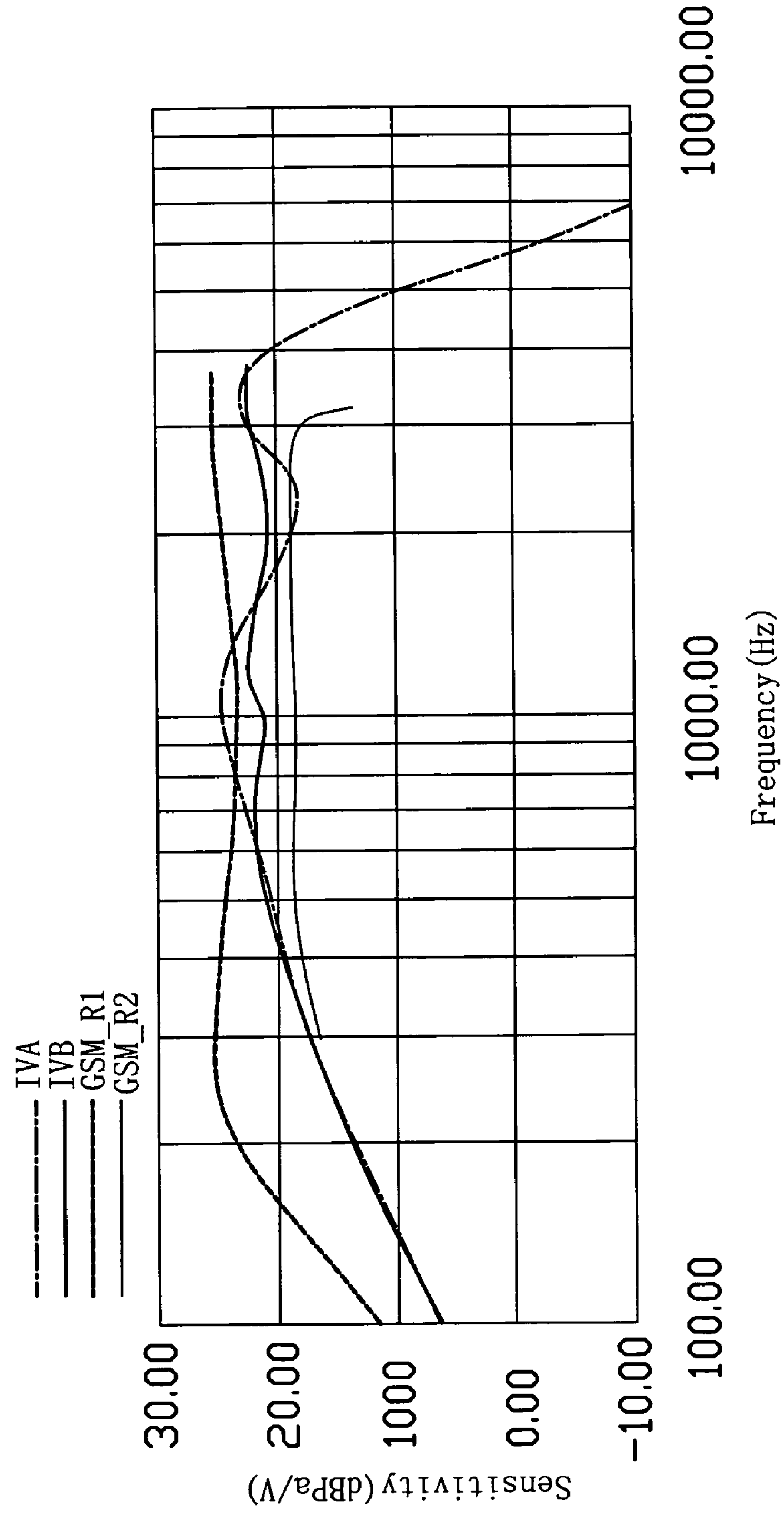
FIG. 5 is an image of adjusting a frequency response curve of a speaker with a third mesh by means of the method of FIG. 1.

Also referring to FIGS. 3-5, three types of meshes (B090, B260 and B045) are respectively mounted on the speaker, and sensitivities of the speaker with the different meshes are respectively tested and recorded. The curve IIA is a frequency response curve of a speaker with a mesh in B090 type received in the housing. The curve IIIA is a frequency response curve of a speaker with a mesh in B260 type received in the housing. The curve IVA is a frequency response curve of a speaker with a mesh in B045 type received in the housing. Data of the curves IIA, IIIA and IVA can be respectively referred in Tables 2, 3 and 4.

TABLE 2

Sensitivity of a speaker with a mesh in B090 type

| | Frequency (Hz) | | | | | | | | |
|---|---|---|---|---|---|---|---|---|---|
| | 100 | 125 | 160 | 200 | 250 | 315 | 400 | 500 | 630 |
| IIA: Sensitivity before adjusting (dBPa/V) | 9.40 | 10.98 | 12.30 | 13.58 | 14.67 | 15.73 | 16.87 | 18.26 | 19.74 |
| IIB: Sensitivity after adjusting (dBPa/V) | 9.97 | 13.55 | 14.87 | 16.15 | 17.24 | 20.30 | 21.44 | 22.83 | 22.31 |

| | Frequency (Hz) | | | | | | | |
|---|---|---|---|---|---|---|---|---|
| | 800 | 1000 | 1250 | 1600 | 2000 | 2500 | 3150 | 4000 |
| IIA: Sensitivity before adjusting (dBPa/V) | 20.98 | 22.40 | 23.07 | 21.44 | 19.10 | 17.29 | 20.05 | 16.57 |
| IIB: Sensitivity after adjusting (dBPa/V) | 21.55 | 20.97 | 21.64 | 22.01 | 21.67 | 20.86 | 23.62 | 19.14 |

TABLE 3

Sensitivity of a speaker with a mesh in B260 type

| | Frequency (Hz) | | | | | | | | |
|---|---|---|---|---|---|---|---|---|---|
| | 100 | 125 | 160 | 200 | 250 | 315 | 400 | 500 | 630 |
| IIIA: Sensitivity before adjusting (dBPa/V) | 7.24 | 9.77 | 12.33 | 15.19 | 17.62 | 19.79 | 21.79 | 23.51 | 24.86 |
| IIIB: Sensitivity after adjusting (dBPa/V) | 7.24 | 9.77 | 12.33 | 15.19 | 17.62 | 19.79 | 21.79 | 23.51 | 21.43 |

| | Frequency (Hz) | | | | | | | |
|---|---|---|---|---|---|---|---|---|
| | 800 | 1000 | 1250 | 1600 | 2000 | 2500 | 3150 | 4000 |
| IIIA: Sensitivity before adjusting (dBPa/V) | 25.68 | 25.78 | 24.11 | 21.31 | 18.98 | 18.85 | 22.77 | 21.28 |
| IIIB: Sensitivity after adjusting (dBPa/V) | 22.25 | 22.35 | 22.11 | 21.31 | 20.55 | 21.42 | 22.77 | 21.85 |

TABLE 4

Sensitivity of a speaker with a mesh in B045 type

| | Frequency (Hz) | | | | | | | | |
|---|---|---|---|---|---|---|---|---|---|
| | 100 | 125 | 160 | 200 | 250 | 315 | 400 | 500 | 630 |
| IVA: Sensitivity before adjusting (dBPa/V) | 6.46 | 8.89 | 11.27 | 13.98 | 16.22 | 18.12 | 19.77 | 21.15 | 22.35 |

TABLE 4-continued

Sensitivity of a speaker with a mesh in B045 type

| | | | | | | | | | |
|---|---|---|---|---|---|---|---|---|---|
| IVB: Sensitivity after adjusting (dBPa/V) | 6.46 | 8.89 | 11.27 | 13.98 | 16.22 | 18.12 | 19.77 | 21.15 | 22.35 |

| | Frequency (Hz) | | | | | | | |
|---|---|---|---|---|---|---|---|---|
| | 800 | 1000 | 1250 | 1600 | 2000 | 2500 | 3150 | 4000 |
| IVA: Sensitivity before adjusting (dBPa/V) | 23.70 | 24.98 | 24.81 | 22.18 | 19.72 | 18.82 | 22.63 | 22.25 |
| IVB: Sensitivity after adjusting (dBPa/V) | 22.27 | 21.55 | 22.81 | 22.18 | 21.29 | 21.39 | 22.63 | 22.82 |

Third, after testing sensitivity of the speaker in different hardware conditions and recording corresponding frequency response curves IA, IIA, IIIA and IVA, a curve that comes closest to falling within a predetermined range for selected frequency ranges is selected to be further adjusted with a filter. In this way, a difference between the adjusted curve and the predetermined curve can be decreased before adjusting.

Fourth, the selected frequency response curve of the speaker is adjusted to a predetermined range (i.e., the range between the curves GSM_R1 and GSM_R2) by a filter. This step includes two substeps:

(1) selecting frequency ranges requiring to be adjusted in the selected curve. The frequency ranges requiring to be adjusted can be the ranges corresponding to the parts of the selected curve that exceed the range between the curves GSM_R1 and GSM_R2, and can also be directly determined according to different demands. This substep avoids adjusting a whole curve, thus decreases workload.

(2) adjusting the parts of the curve that corresponding to the selected frequency ranges. A typical audio filter known in the art is used to filter audio signals received by the speaker to adjust the frequency response curve to fall as much as possible within the predetermined range.

As detailed above, in use, a curve that comes closest to falling within a predetermined range for selected frequency ranges is selected from the curves IA, IIA, IIIA and IVA, and then is adjusted by the filter. Also referring to FIGS. 2-5, when anyone of the curves IA, IIA, IIIA and IVA are selected, it is adjusted by the filter to form a corresponding adjusted curve, i.e., the curve IB, IIB, IIIB or IVB. Data of the curves IB IIB, IIIB and IVB can be respectively referred in Tables 1-4. It is shown that anyone of the curves IB, IIB, IIIB and IVB is positioned in the range between the curves GSM_R1 and GSM_R2. Results of adjusting the selected curve with the filter are recorded, and software of the speaker is amended according to the record to further filter the audio signal to ensure more of the curve falls within the predetermined range. In this way, when the speaker is used, software installed in the portable electronic device and configured for controlling the speaker can eliminate unwanted audio signals, and aid in controlling the speaker to achieve a predetermined sensitivity.

Figure 6:
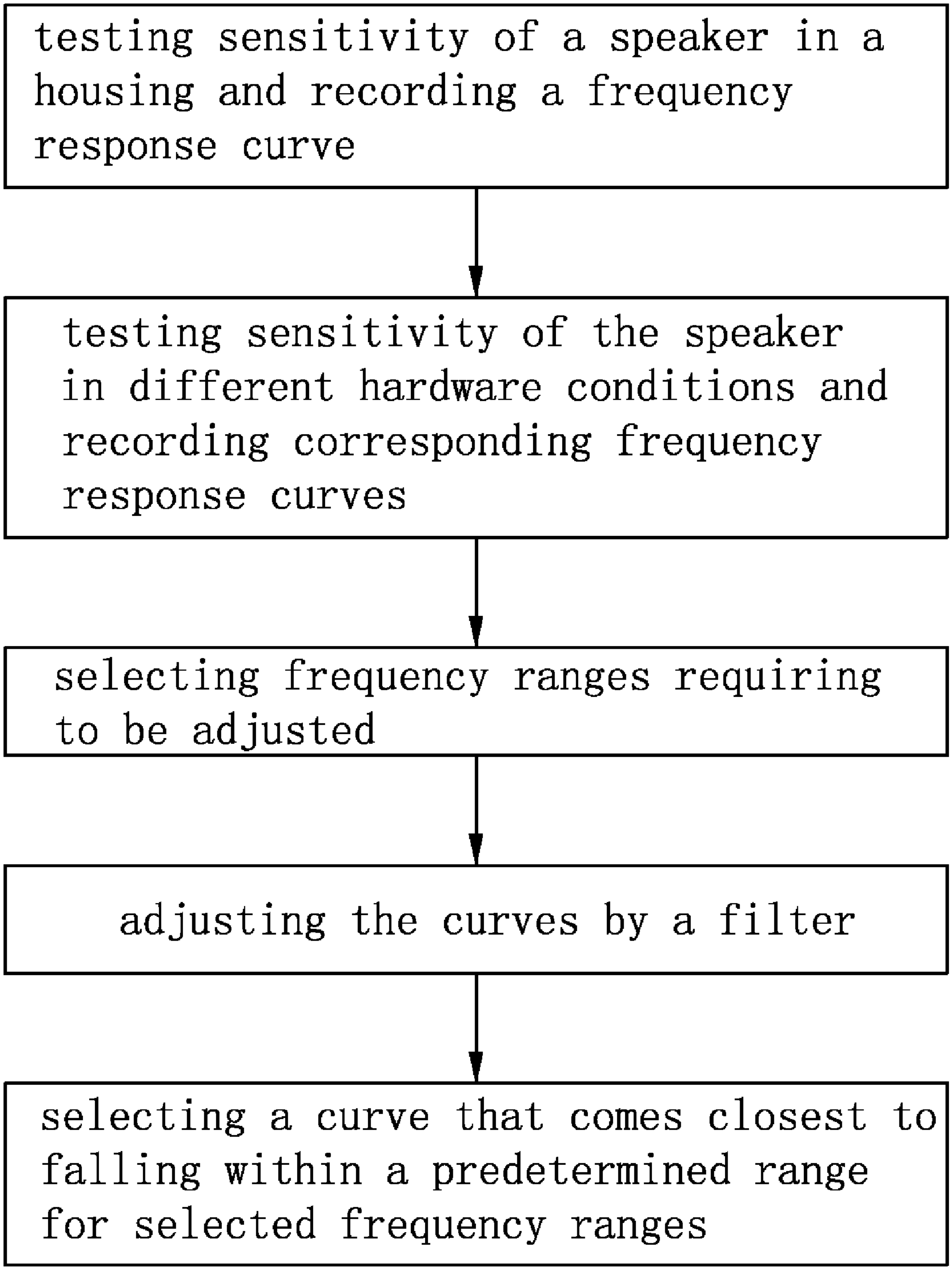
FIG. 6 is a diagram of a method for adjusting a frequency response curve of a speaker, in accordance with a second embodiment.

Also referring to FIG. 6, in a method in accordance with a second embodiment, all curves IA, IIA, IIIA and IVA can also be adjusted by the filter according to the step S4 to form the curves IB, IIB, IIIB and IVB at first, and a curve that comes closest to falling within a predetermined range for selected frequency ranges is then selected from the curves IB, IIB, IIIB and IVB according to the third step, thus software of the speaker is amended according to the adjusted selected curve.

Understandably, in the present method foe adjusting frequency response curve, the speaker is tested in housing of portable electronic devices, and further tested with different types of meshes mounted thereon. In this way, a preferable hardware condition of using the speaker can be selected in the present method, and a difference between the adjusted curve and the predetermined curve can be decreased before adjusting by the filter. Therefore, both hardware conditions and software conditions of the speaker are amended in the present method, thus the speaker can get better sensitivity.

It is to be further understood that even though numerous characteristics and advantages of the present embodiments have been set forth in the foregoing description, together with details of structures and functions of various embodiments, the disclosure is illustrative only, and changes may be made in detail, especially in matters of shape, size, and arrangement of parts within the principles of the present invention to the full extent indicated by the broad general meaning of the terms in which the appended claims are expressed.

What is claimed is:

1. A method for adjusting frequency response curve of a speaker, the method comprising the steps of:
- testing sensitivity of the speaker in at least two types of hardware conditions and recording corresponding frequency response curves, the testing sensitivity of the speaker including substeps:
  - testing sensitivity of the speaker in a housing and recording a frequency response curve to show the sensitivity; and
  - testing sensitivity of the speaker with a mesh mounted thereon in the housing and recording a frequency response curve to show the sensitivity;
- selecting a frequency response curve that comes closest to falling within a predetermined range for selected frequency ranges; and
- adjusting the selected frequency response curve with a filter.

2. The method as claimed in claim 1, wherein the step of testing sensitivity of the speaker further includes a substep:
- respectively testing sensitivity of the speaker with a plurality of types of meshes mounted thereon in a housing and recording a frequency response curve to show the sensitivity.

3. The method as claimed in claim 1, further comprising a step of selecting frequency ranges required to be adjusted in the selected curve after the step of selecting a frequency response curve that comes closest to falling within a predetermined range for selected frequency ranges.

4. A method for adjusting frequency response curve of a speaker, comprising the steps of:
- testing sensitivity of the speaker in at least two types of hardware conditions and recording corresponding frequency response curves, the testing sensitivity of the speaker including substeps:

testing sensitivity of the speaker in a housing and recording a frequency response curve to show the sensitivity; and testing sensitivity of the speaker with a mesh mounted thereon in the housing and recording a frequency response curve to show the sensitivity;

adjusting the selected frequency response curve with a filter; and selecting a frequency response curve that comes closest to falling within a predetermined range for selected frequency ranges.

5. The method as claimed in claim 4, wherein the step of testing sensitivity of the speaker in at least two types of hardware conditions and recording corresponding frequency response curves further includes substep:

respectively testing sensitivity of the speaker with a plurality of types of meshes mounted thereon in a housing and recording a frequency response curve to show the sensitivity.

6. The method as claimed in claim 4, further comprising a step of selecting frequency ranges required to be adjusted in the frequency response curves after the step of testing sensitivity of the speaker in at least two types of hardware conditions and recording corresponding frequency response curves.

* * * * *